(12) United States Patent
Hayashi

(10) Patent No.: US 11,232,967 B2
(45) Date of Patent: Jan. 25, 2022

(54) STAGE AND PLASMA PROCESSING APPARATUS

(71) Applicant: Tokyo Electron Limited, Tokyo (JP)

(72) Inventor: Daisuke Hayashi, Miyagi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 16/402,381

(22) Filed: May 3, 2019

(65) Prior Publication Data
US 2019/0348316 A1 Nov. 14, 2019

(30) Foreign Application Priority Data
May 10, 2018 (JP) .............................. JP2018-091438

(51) Int. Cl.
*H01L 21/683* (2006.01)
*H01J 37/32* (2006.01)
*H01L 21/687* (2006.01)

(52) U.S. Cl.
CPC .... *H01L 21/6833* (2013.01); *H01J 37/32642* (2013.01); *H01J 37/32724* (2013.01); *H01L 21/68735* (2013.01); *H01J 2237/334* (2013.01)

(58) Field of Classification Search
CPC ........... H01L 21/6833; H01L 37/32724; H01L 21/68735; H01J 37/32642; H01J 37/32724; H01J 2237/334
See application file for complete search history.

(56) References Cited

U.S. PATENT DOCUMENTS

| | | | | |
|---|---|---|---|---|
| 2006/0279899 | A1* | 12/2006 | Aihara | H01L 21/6831 361/234 |
| 2008/0138645 | A1* | 6/2008 | Kawajiri | H01L 21/6833 428/613 |
| 2011/0157760 | A1* | 6/2011 | Willwerth | H01L 21/6833 361/234 |
| 2012/0076574 | A1* | 3/2012 | Parkhe | B23K 1/0008 403/272 |
| 2014/0209245 | A1* | 7/2014 | Yamamoto | H01L 21/6831 156/345.53 |

FOREIGN PATENT DOCUMENTS

JP 06-053174 A 2/1994

* cited by examiner

*Primary Examiner* — Eric A. Gates
*Assistant Examiner* — Paul M Janeski
(74) *Attorney, Agent, or Firm* — Abelman, Frayne & Schwab

(57) ABSTRACT

Disclosed is a stage including: an electrostatic chuck having a substrate placement surface on which a substrate is placed; and an electrostatic chuck placement plate on which the electrostatic chuck is placed. The electrostatic chuck and the electrostatic chuck placement plate are fastened by a plurality of first fasteners from a side of the electrostatic chuck placement plate, and the stage is fastened to a support provided on an opposite side of the electrostatic chuck of the electrostatic chuck placement plate by a plurality of second fasteners on a radially outer side of the placement surface.

19 Claims, 7 Drawing Sheets

STAGE AND PLASMA PROCESSING APPARATUS

CROSS-REFERENCE TO RELATED APPLICATIONS

This application is based on and claims priority from Japanese Patent Application No. 2018-091438, filed on May 10, 2018 with the Japan Patent Office, the disclosure of which is incorporated herein in its entirety by reference.

TECHNICAL FIELD

The present disclosure relates to a stage and a plasma processing apparatus.

BACKGROUND

Japanese Patent Laid-Open Publication No. 06-053174 discloses a stage provided with a susceptor, a heater fixing base, and a susceptor support base inside a processing apparatus. The susceptor, the heater fixing base, and the susceptor support base are stacked in this order from above. An electrostatic chuck is provided in the center of the upper surface of the susceptor, and the electrostatic chuck holds a semiconductor wafer. The susceptor is removably attached to the susceptor support base by bolts at the peripheral edge thereof. Further, the heater fixing base accommodates a temperature regulation heater. The heater fixing base is removably attached to the susceptor support base by bolts at the peripheral edge thereof.

SUMMARY

An aspect of the present disclosure relates to a stage including an electrostatic chuck having a substrate placement surface on which a substrate is placed, and an electrostatic chuck placement plate on which the electrostatic chuck is placed. The electrostatic chuck and the electrostatic chuck placement plate are fastened by a plurality of first fasteners from a side of the electrostatic chuck placement plate, and the stage is fastened to a support provided on an opposite side of the electrostatic chuck of the electrostatic chuck placement plate by a plurality of second fasteners on a radially outer side of the placement surface.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

First, a plasma processing apparatus and a stage of the related art will be described on the basis of the configuration described in Japanese Patent Laid-Open Publication No. 06-053174.

In a semiconductor device manufacturing process, a plasma processing apparatus generates plasma by exciting a processing gas, and processes a semiconductor substrate (hereinafter referred to as a "substrate") by the plasma. The plasma processing apparatus is provided with a stage including a substrate placement surface. When an electrostatic chuck on which a substrate is placed is provided as in the stage described in Japanese Patent Laid-Open Publication No. 06-053174, it is impossible to provide a screw hole in the substrate placement surface in the electrostatic chuck. For this reason, the susceptor including the electrostatic chuck needs to be fastened to the susceptor support base by a bolt at the outer peripheral portion on the radially outer side of the substrate placement surface.

Figure 1:
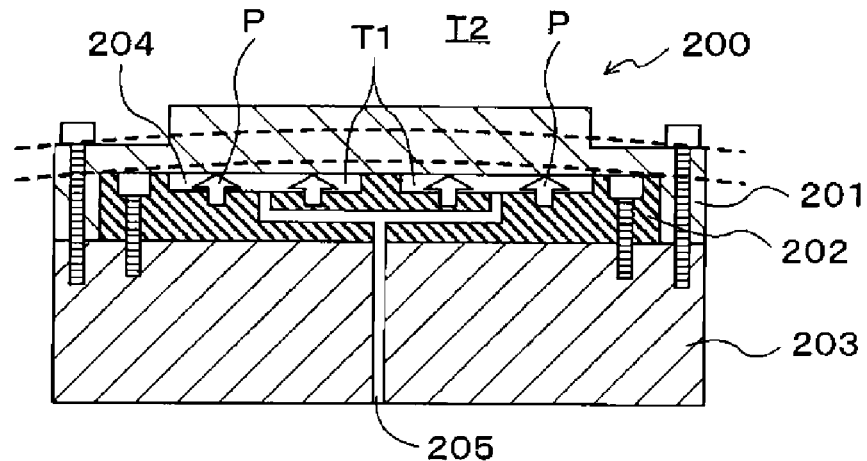
FIG. 1 is an explanatory view of a stage of the related art.

Here, as illustrated in FIG. 1, the stage 200 described in Japanese Patent Laid-Open Publication No. 06-053174 has a configuration in which a susceptor 201, a heater fixing base 202, and a susceptor support base 203 are stacked in this order from the upper side. A plurality of (e.g., two) heaters 204 are provided on the upper surface of the heater fixing base 202. The heater 204 is connected to a power supply 205 to supply power to the heater 204. The power supply unit is connected to the heater 204 through the susceptor support base 203 and further through the heater fixing base 202. In addition, the space in which the heater 204 is installed communicates with the power supply 205 and is formed as an air space T1. That is, the atmospheric pressure P is applied between the susceptor 201 and the heater fixing base 202. Meanwhile, the processing space T2 above the susceptor 201 is in a vacuum atmosphere during a processing. Moreover, the susceptor 201 is not fastened to the heater fixing base 202, and is only fixed to the susceptor support base 203 at the outer peripheral portion thereof. Then, the susceptor 201 may warp in an upward convex shape (dotted lines in FIG. 1) by a pressure difference between the atmosphere space T1 (atmospheric pressure P) and the processing space T2 (vacuum atmosphere).

Figure 2:
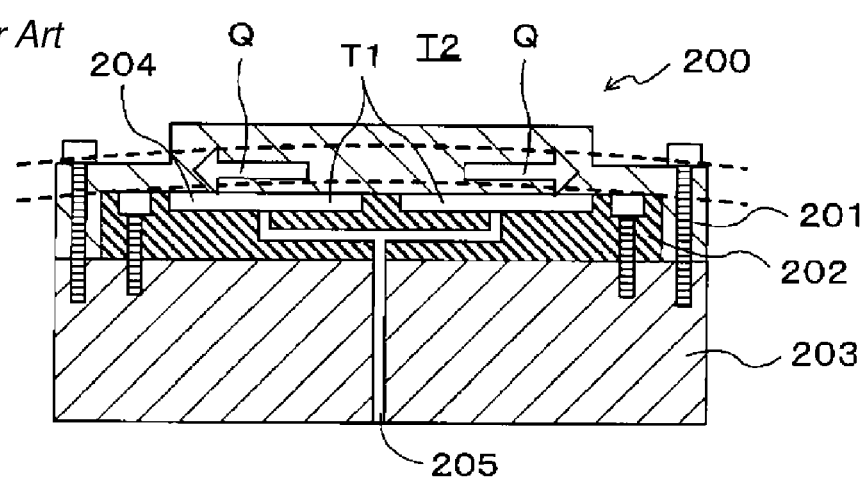
FIG. 2 is an explanatory view of a stage of the related art.

Further, as illustrated in FIG. 2, in the stage 200, when the materials of the susceptor 201 and the heater fixing base 202 are different, the heater 204 is energized to raise the temperature of the susceptor 201 and the heater fixing base 202, whereby linear expansion stress Q is generated in the susceptor 201 due to a difference in linear expansion. In this case, since the outer peripheral portion of the susceptor 201 is fixed, the linear expansion stress Q cannot be released. Then, the above-mentioned pressure difference between the atmosphere space T1 (atmospheric pressure P) and the processing space T2 (vacuum atmosphere) also increases. Thus, the susceptor 201 may warp in an upward convex shape (dotted lines in FIG. 2).

As described above, when the susceptor 201 warps in the upward convex shape, the substrate placed on the susceptor 201 (the electrostatic chuck) warps in the upward convex shape according to the distortion of the susceptor 201. In such a case, heat conduction changes between the substrate and the stage 200, but in consideration of the temperature accuracy required recently, it is necessary to suppress the warpage of the substrate.

Therefore, the technique according to the present disclosure suppresses the distortion of the stage in the stage including an electrostatic chuck and an electrostatic chuck placement plate. Specifically, the electrostatic chuck and the electrostatic chuck placement plate are stacked in this order from the upper side, and the electrostatic chuck and the electrostatic chuck placement plate are fastened by a first fastener from the lower side. Thus, the rigidity of the stage is improved, and the above-mentioned distortion is suppressed. Furthermore, in order to fix the stage configured in this way to the lower support member, the stage is fastened to the support from the upper side with a second fastener. With this configuration, it is possible to implement a stage that, which is easy to attach or detach.

Hereinafter, the configuration of the stage according to the present embodiment and a plasma processing apparatus including the stage will be described with reference to the drawings. In this specification and the drawings, elements having substantially the same functional configurations will be denoted by the same reference numerals, and a redundant description will be omitted.

Figure 3:
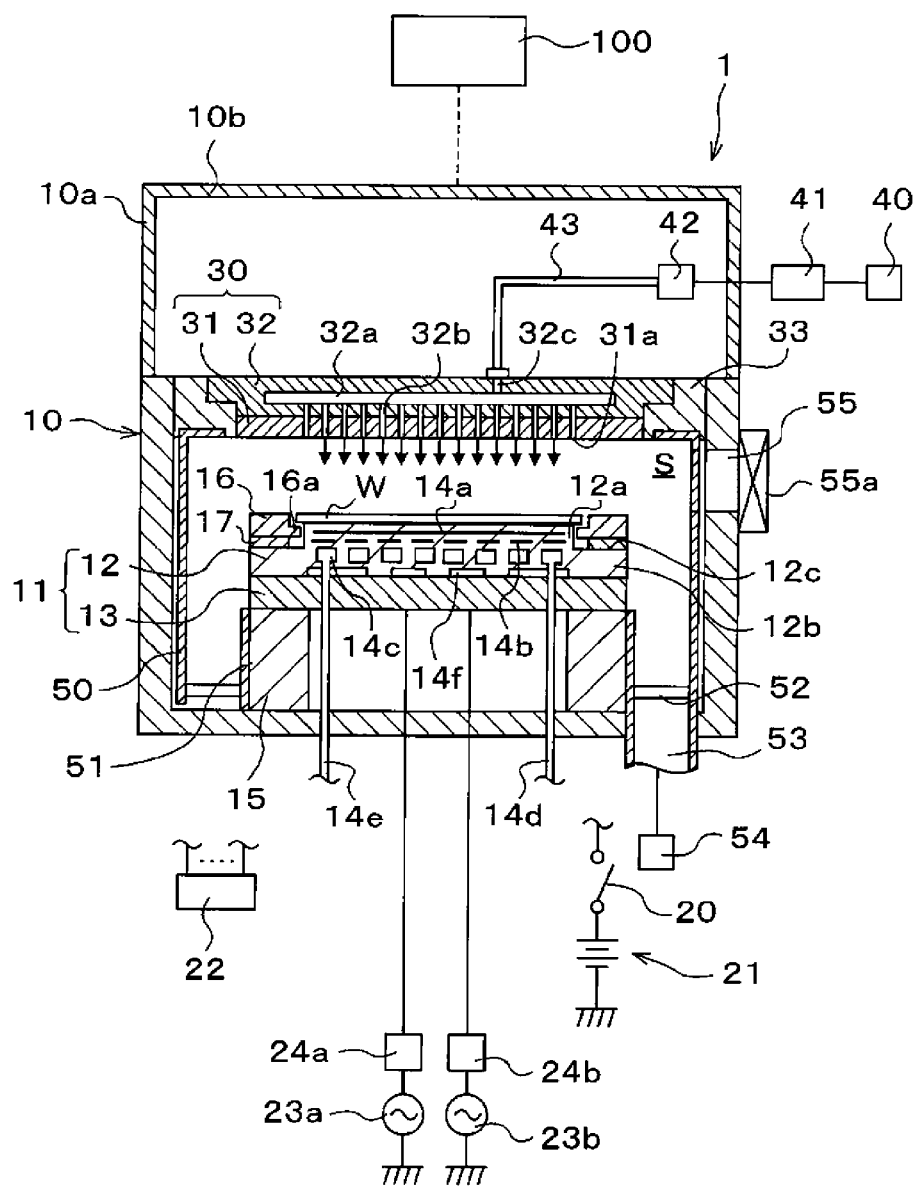
FIG. 3 is a vertical cross-sectional view schematically illustrating the outline of a configuration of a plasma processing apparatus according to an embodiment.

FIG. 3 is a vertical cross-sectional view schematically illustrating the outline of a configuration of a plasma processing apparatus according to an embodiment. In the present embodiment, a capacitively coupled parallel plate plasma etching apparatus is described as an example of the plasma processing apparatus 1.

As illustrated in FIG. 3, the plasma processing apparatus 1 includes a substantially cylindrical processing container 10. The processing container 10 is made of, for example, aluminum, and the surface thereof is subjected an anodic oxidation treatment. The processing container 10 defines a processing space S in which plasma is generated.

A stage 11 on which a substrate W is placed is provided in the processing container 10. The stage 11 includes an electrostatic chuck 12 and an electrostatic chuck placement plate 13. The electrostatic chuck 12 includes a placement portion 12a and a base portion 12b. The electrostatic chuck placement plate 13 is provided below the base portion 12b of the electrostatic chuck 12. The electrostatic chuck placement plate 13 is made of a conductive metal such as, for example, aluminum, and has a function as a lower electrode.

Each of the placement portion 12a and the base portion 12b is made of, for example, an insulator. The placement portion 12a is provided with an electrode 14a between the insulators. A DC power supply 21 is connected to the electrode 20 through a switch 20. Then, the substrate W is attracted to the placement surface of the placement portion 12a by a coulomb force generated by applying a DC voltage from the DC power supply 21 to the electrode 14a.

Further, below the electrode 14a, a heater 14b which is a heating element is provided to extend annularly so as to surround the center of the stage 11. The heater 14b is connected to the heater power supply 22, and it is possible to raise the temperature of the stage 11 and the substrate W placed on the stage 11 to a predetermined temperature by applying a voltage from the heater power supply 22.

In addition, the heater 14b may include, for example, a heater that heats the central region, and another heater that extends annularly to surround the outside of the central region. In this case, it is possible to control the temperature of the substrate W placed on the placement surface for each of regions located in the radial direction with respect to the center of the substrate W.

Further, a coolant flow path 14c is formed inside the base portion 12b. A coolant is supplied to the coolant flow path 14c from a chiller (not illustrated) provided outside the processing container 10 through a coolant inlet pipe 14d. The coolant supplied to the coolant flow path 14c is returned to the chiller through a coolant outlet pipe 14e. As described above, it is possible to cool the stage 11 and the substrate W placed on the stage 11 to a predetermined temperature by circulating a coolant such as cooling water in the coolant flow path 14c.

Further, the stage 11 is provided with a gas flow path 14f configured to supply a cold heat transfer gas (a backside gas) such as helium gas to the rear surface of the substrate W. In the example of FIG. 3, only a portion of the gas flow path 14f, that is, only the gas flow path 14f in the base portion 12b is illustrated. The gas flow path 14f is connected to a gas source (not illustrated). It is possible to control the substrate W held by the electrostatic chuck 12 on the placement surface of the stage 11 to a predetermined temperature by the cold heat transfer gas.

A first RF power supply 23a and a second RF power supply 23b are connected to the electrostatic chuck placement plate 13 through a first matcher 24a and a second matcher 24b, respectively, so as to apply power to the stage 11.

The first RF power supply 23a is a power supply that generates radio-frequency power for plasma generation. A radio-frequency power having a frequency in the range of 27 MHz to 100 MHz (in an example, 40 MHz) is supplied from the first RF power supply 23a to the electrostatic chuck placement plate 13 of the stage 11. The first matcher 24a has a circuit configured to match the output impedance of the first RF power supply 23a with the input impedance on the load side (the electrostatic chuck placement plate 13 side).

The second RF power supply 23b generates radio-frequency power (radio-frequency bias power) for drawing ions into the substrate W, and supplies the radio-frequency bias power to the electrostatic chuck placement plate 13. The frequency of the radio-frequency bias power is a frequency in the range of 400 kHz to 13.56 MHz (in an example, 3 MHz). The second matcher 24a has a circuit configured to match the output impedance of the second RF power supply 23a with the input impedance on the load side (the electrostatic chuck placement plate 13 side).

The stage 11 configured as described above is fastened to a substantially cylindrical support 15 provided on the bottom portion of the processing container 10. The support 15 is made of, for example, an insulator such as ceramics.

A focus ring 16 formed in an annular shape is provided above the base portion 12b of the electrostatic chuck 12 so as to surround the placement portion 12a in a plan view. The focus ring 16 is provided through a spacer 17 so as to be coaxial with the electrostatic chuck 12. In addition, the focus ring 16 is also provided to improve the uniformity of a plasma processing. The focus ring FR is made of a material appropriately selected depending on the plasma processing to be performed, and may be made of, for example, silicon or quartz.

On the inner surface of the focus ring 16, a protrusion 16a that protrudes radially inward is formed. That is, the inner diameter of the focus ring 16 differs depending on the position of the inner surface. For example, the inner diameter of the portion where the protrusion 16a is not formed is larger than the outer diameter of the substrate W. Meanwhile, the inner diameter of the portion where the protrusion 16a is formed is smaller than the outer diameter of the substrate W.

A shower head 30 is provided above the stage 11 so as to face the stage 11. The shower head 30 has a function as an upper electrode, and includes an electrode plate 31 disposed to face the processing space S, and an electrode support 32 provided above the electrode plate 31. The electrode plate 31 functions as the electrostatic chuck placement plate 13 and a pair of electrodes (the upper and lower electrodes). In addition, the shower head 30 is supported in the upper portion of the processing container 10 via an insulative blocking member 33.

The electrode plate 31 is formed with a plurality of gas jet holes 31a configured to supplying a processing gas supplied from a gas diffusion chamber 32a (described later) to the processing space S. The electrode plate 31 is made of, for example, a low resistance conductor or semiconductor which generates little Joule heat.

The electrode support 32 detachably supports the electrode plate 31, and is made of, for example, a conductive material such as, for example, aluminum having a surface subjected to an anodic oxidation treatment. The gas diffusion chamber 32a is formed inside the electrode support 32. From the gas diffusion chamber 32a, a plurality of gas flow holes 32b communicating with the gas jet holes 31a are formed. In addition, a gas source group 40 configured to supply a processing gas to the gas diffusion chamber 32a is connected to the electrode support 32 through a flow rate controller group 41, a valve group 42, a gas supply pipe 43, and a gas introduction hole 32c.

The gas source group 40 includes a plurality of gas sources necessary for a plasma processing. In the plasma processing apparatus 1, the processing gas from at least one gas source selected from the gas source group 40 is supplied to the gas diffusion chamber 32a through the flow rate controller group 41, the valve group 42, the gas supply pipe 43, and the gas introduction hole 32c. In addition, the processing gas supplied to the gas diffusion space 32a is dispersed in the form of a shower and supplied into the processing space S through the gas flow holes 32b and the gas jet holes 31a.

In addition, in the plasma processing apparatus 1, a cylindrical ground conductor 10a is provided to extend upward from the side wall of the processing container 10 to a position above the height position of the shower head 30. The cylindrical ground conductor 10a has a ceiling plate 10b in the upper portion thereof.

In the plasma processing apparatus 1, a deposit shield 50 is detachably provided along the inner wall of the processing container 10. The deposit shield 50 prevents an etching byproduct (deposit) from adhering to the inner wall of the processing container 10, and is configured by coating, for example, an aluminum material with ceramics such as $Y_2O_3$. Similarly, a deposit shield 51 is detachably provided on the outer peripheral surface of the support 15, which is a surface facing the deposit shield 50.

An exhaust plate 52 is provided in the bottom portion of the processing container 10 and between the inner wall of the processing container 10 and the support 15. The exhaust plate 52 is configured by coating, for example, an aluminum material with ceramics such as, for example, $Y_2O_3$. The processing space S is in communication with an exhaust port 53 through the exhaust plate 52. An exhaust device 54 such as, for example, a vacuum pump, is connected to the exhaust port 53, and the inside of the processing space S is configured to be decompressed by the exhaust device 54.

In addition, a loading/unloading port 55 for a substrate W is formed in the side wall of the processing container 10, and the loading/unloading port 55 is configured to be opened and closed by a gate valve 55a.

The plasma processing apparatus 1 described above is provided with a controller 100. The controller 100 is, for example, a computer, and has a program storage unit (not illustrated). In the program storage unit, a program for controlling a processing of the substrate W in the plasma processing apparatus 1 is stored. The program storage unit also stores a control program for controlling various processings by a processor and a program for causing each component of the plasma processing apparatus 1 to execute a processing depending on a process condition, that is, a process recipe. The above program may be recorded in a storage medium readable by a computer, and may be installed in the controller 100 from the storage medium.

Figure 4:
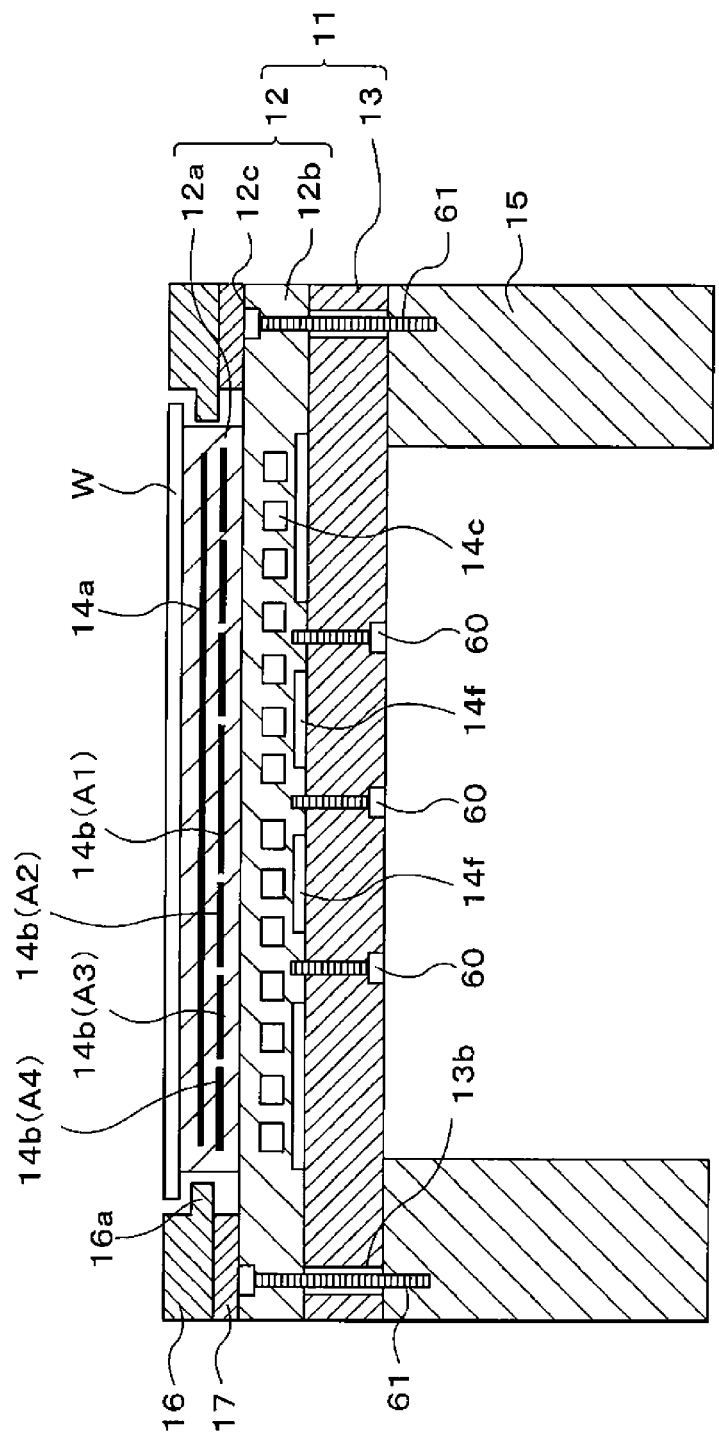
FIG. 4 is a vertical cross-sectional view schematically illustrating the outline of a configuration of a stage according to a first embodiment.
Figure 5:
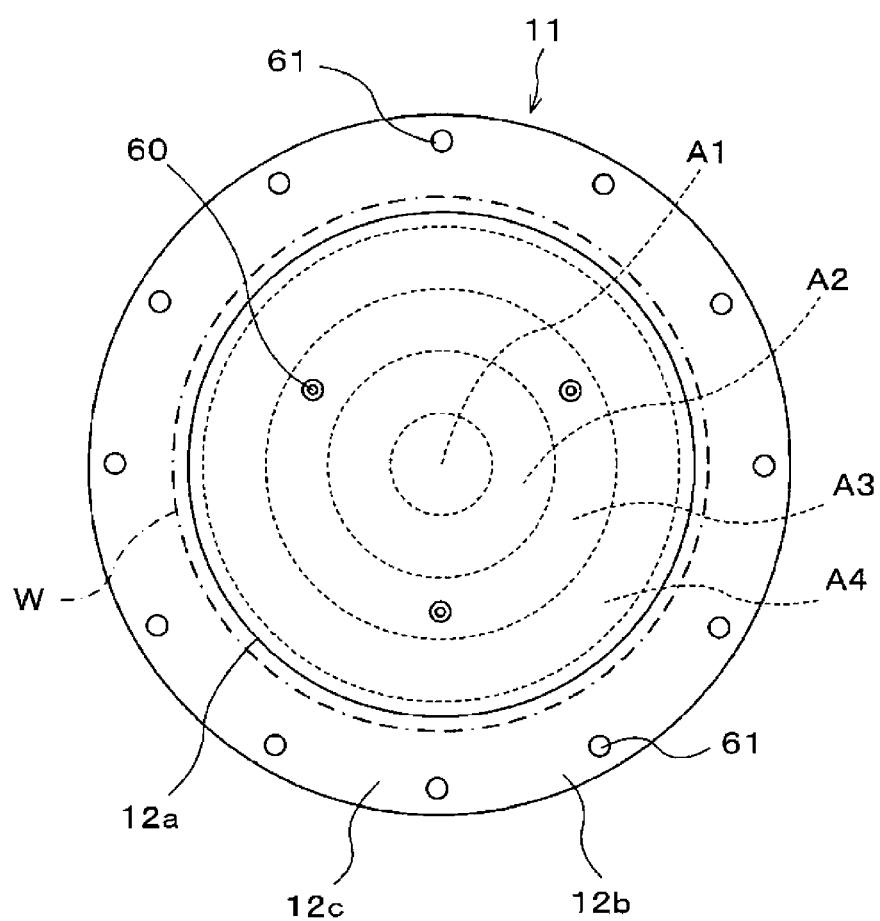
FIG. 5 is a plan view schematically illustrating the outline of a configuration of the stage according to the first embodiment.

Next, details of the stage 11 according to the first embodiment will be described with reference to FIGS. 4 and 5. FIGS. 4 and 5 are a vertical cross-sectional view and a plan view, each of which illustrates the outline of the configuration of the stage 11 concerning the present embodiment.

As described above, the stage 11 includes the electrostatic chuck 12 and the electrostatic chuck placement plate 13. The electrostatic chuck 12 also has a placement portion 12a having, on the upper surface thereof, a placement surface configured to place a substrate W thereon by electrostatic attraction, and a base portion 12b configured to support the placement portion 12a from below. The placement portion 12a and the base portion 12b are fixed to each other, for example, via an adhesive. Each of the placement portion 12a and the base portion 12b has a substantially disc shape. The placement portion 12a is made of, for example, ceramics. The diameter of the placement portion 12a is substantially the same as the diameter of the substrate W, or smaller than the diameter of the substrate W. The diameter of the base portion 12b is larger than the diameter of the placement portion 12a. In addition, an outer peripheral region 12c is formed on the upper surface of the base portion 12b and outside the outer periphery of the placement portion 12a due to the difference in outer diameter between the placement portion 12a and the base portion 12b. The outer peripheral region 12c is a region surrounding the placement portion 12a and extends substantially annularly. In the present embodiment, the upper surface of the outer peripheral region 12c is formed at a lower position than the placement surface of the substrate W of the placement portion 12a.

An electrode 14a for electrostatic attraction of the substrate W is provided inside the electrostatic chuck 12 and on the inner peripheral side of the outer peripheral region 12c, that is, inside the placement portion 12a. Further, one or more heaters 14b is provided inside the placement portion 12a and below the electrode 14a. In the present embodiment, a total of four heaters 14b are respectively provided in a circular region A1 in the center of the placement portion 12a and a plurality of concentric annular regions A2, A3, and A4 surrounding the circular region A1. The heaters 14b are supplied with individually adjusted power from the heater power supply 22. As a result, the heat generated by each heater 14b is individually controlled, so that the temperature of each of the regions A1 to A4 can be individually adjusted.

The coolant flow path 14c formed inside the base portion 12b of the electrostatic chuck 12 is disposed inside the base portion 12b and radially inside the outer peripheral region 12c, that is, below the heater 14b. The coolant flow path 14c is positioned below the substrate W and functions to absorb the heat of the substrate W.

Figure 6:
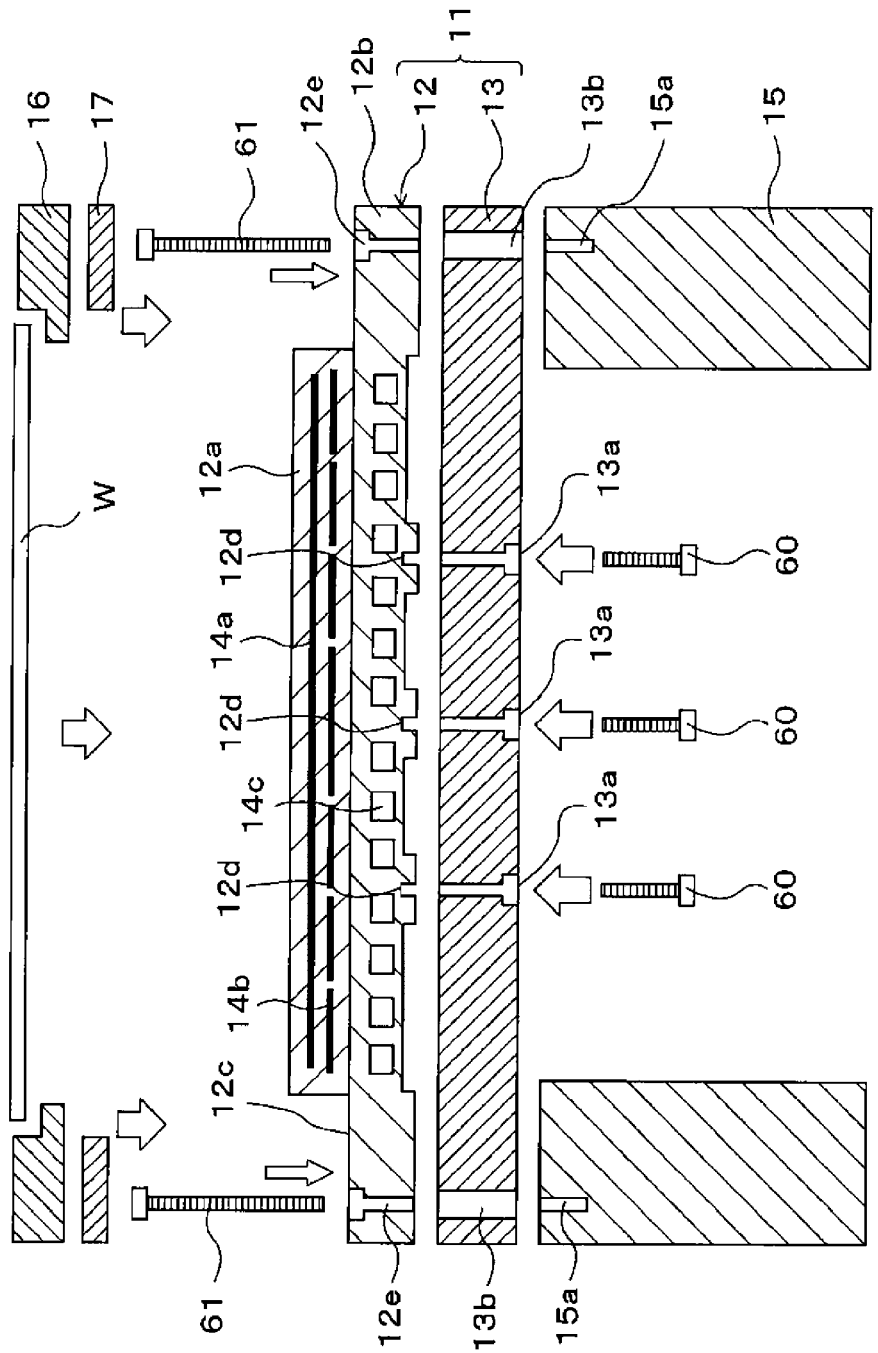
FIG. 6 is an explanatory view schematically illustrating a method of assembling the stage according to the first embodiment.

The electrostatic chuck placement plate 13 has a substantially disc shape having a diameter substantially the same as that of the base portion 12b. The electrostatic chuck 12 and the electrostatic chuck placement plate 13 form the stage 11 by being fastened to each other by first fasteners 60. The first fasteners 60 fasten the electrostatic chuck 12 and the electrostatic chuck placement plate 13 to each other from the electrostatic chuck placement plate 13 side toward the electrostatic chuck 12 side, as illustrated in FIG. 6. The first fasteners 60 are fastened to fastening holes 12d formed in the base portion 12b via through holes 13a formed in the electrostatic chuck placement plate 13. For example, screws are used as the first fasteners 60, which are screwed into the fastening holes 12d in which screw grooves are formed.

In the present embodiment, as illustrated in FIG. 5, a plurality of (e.g., three) first fasteners 60 are provided radially inside second fasteners 61 (described later) and arranged along a concentric circle with the stage 11 (e.g., FIG. 3) at regular intervals. That is, the first fasteners 60 may fasten the electrostatic chuck 12 and the electrostatic chuck placement plate 13 constituting the stage 11 radially inside the second fasteners 61 (described later), that is, in the vicinity of the center of the stage 11.

In addition, although the present embodiment is an example and the number of the first fasteners 60 is not limited to three as mentioned above, three or more first fasteners 60 may be used in order to prevent the lateral shift of the members which constitute the stage 11. Further, the first fasteners 60 may not be fixed along the concentric circle as long as the first fasteners 60 are arranged to be capable of preventing the electrostatic chuck 12 and the electrostatic chuck placement plate 13 from being laterally deviated, thereby improving bending rigidity. In addition, for example, the first fasteners 60 may be arranged radially along concentric circles having different diameters. That is, the plurality of the first fasteners 60 may be provided doubly or more.

The stage 11 configured in this way is fastened from the electrostatic chuck 12 side by the second fasteners 61 on the support 15 provided below the stage 11. As illustrated in FIG. 6, in the electrostatic chuck 12, through holes 12e are formed in the outer peripheral region 12c in which the heater 14b and the coolant channel 14c are not provided. In addition, through holes 13b are formed in the outer peripheral portion of the electrostatic chuck placement plate 13 at positions corresponding to the through holes 12e. The second fasteners 61 are inserted into the through holes 12e and 13b and fastened to the fastening holes 15a formed in the support 15. For example, screws are used as the second fasteners 61, and are screwed into the fastening holes 15a in which screw grooves are formed.

In the present embodiment, as illustrated in FIG. 5, twelve second fasteners 61 are provided along the outer peripheral region 12c of the electrostatic chuck 12, and the outer peripheral portions of the electrostatic chuck placement plate 13 and the support 15 at regular intervals.

Here, as illustrated in FIGS. 4 and 6, the second fasteners 61 is provided to through the electrostatic chuck 12 and the electrostatic chuck placement plate 13, and thus are longer than the first fasteners 60. Thus, for example, when long bolts are used as the fasteners, the second fasteners 61 may be distorted in the middle of the through holes to be inserted for fastening, for example, in the through holes 13b in the present embodiment. That is, in some cases, the second fasteners 61 may warp toward the radial outside of the electrostatic chuck placement plate 13 from the through holes 13b.

In order to cope with the warpage of the second fasteners 61, for example, as in in FIG. 4, each through hole 13b may be formed to have a diameter larger than that of the second fasteners 61 such that a gap is formed between the second fastener 61 and the inner wall surface of the through hole 13b. By having such a configuration, the warpage of the second fastener 61 can be absorbed by the gap, and as a result, the warpage of the stage 11 can be suppressed.

As described above, the stage 11 is formed by fastening the electrostatic chuck 12 and the electrostatic chuck placement plate 13 with the first fasteners 60 from the electrostatic chuck placement plate 13 side. In addition, the stage 11 formed in this manner is fastened to the support 15 from the electrostatic chuck 12 side by the second fasteners 61. With such a configuration, the stage 11 can be easily attached to and detached from the support 15 only by access from the electrostatic chuck 12 side.

In addition, according to the configuration described above, it is possible to perform the fastening of the stage 11 by the first fasteners 60 from the electrostatic chuck placement plate 13 side of the stage 11 in the vicinity of the center. In such a case, it is possible to suppress the occurrence of the distortion in the convex shape of the stage 11 due to the atmospheric pressure and the linear expansion stress, compared with the case where the fastening is performed only in the outer peripheral portion of the stage as in the related art. In addition, since the fastening is performed from the electrostatic chuck placement plate 13, it is not necessary to provide through holes or fastening holes in the placement portion 12a. For this reason, it is possible to uniformly perform temperature control of the substrate W by the heater 14b and the coolant channel 14c in the substrate surface.

As described above, according to the present embodiment, a stage 11 on which a substrate W is placed includes an electrostatic chuck 12 having a placement surface for the substrate W, and an electrostatic chuck placement plate 13 on which the electrostatic chuck 12 is placed. The electrostatic chuck 12 and the electrostatic chuck placement plate 13 are fastened by a plurality of first fasteners 60 from the electrostatic chuck placement plate 13 side, and the stage 11 is fastened to the support 15 by a plurality of second fasteners 61 from the electrostatic chuck 12 side in the outer peripheral region 12c which is located on the radially outer side of the placement surface for the substrate W. Thus, since the electrostatic chuck 12 and the electrostatic chuck placement plate 13 can be fastened from the electrostatic chuck placement plate 13 side by the first fasteners 60, the bending rigidity of the stage 11 is improved, and it is possible to suppress the warpage of the substrate W placed on the stage 11.

Further, with respect to the support 15, the stage 11 is fixed to the outer peripheral region 12c of the stage 11 by the second fasteners 61 from the electrostatic chuck 12 side. For this reason, the stage 11 can be easily attached and detached only by access from the electrostatic chuck 12 side.

Here, in the present embodiment, the case where the electrostatic chuck placement plate 13 is disposed below the electrostatic chuck 12 and in addition the support 15 is disposed below the stage 11 has been described. The plurality of first fasteners 60 are provided from below and the plurality of second fasteners 61 were provided from above. However, the arrangement of the electrostatic chuck 12, the electrostatic chuck placement plate 13, and the support 15 is not limited to this. In any arrangement, when the electrostatic chuck 12 and the electrostatic chuck placement plate 13 are fastened to each other by the first fasteners 60 from the electrostatic chuck placement plate 13 side and the stage 11 are fastened to the support 15 by the second fasteners 62 from the electrostatic chuck 12 side, the above-described effect can be obtained.

In addition, according to the present embodiment, the plurality of first fasteners 60 and the plurality of second fasteners 61 are respectively disposed along the concentric circles of the electrostatic chuck placement plate 13, the outer peripheral portion of the stage 11 is fastened to the support 15 by the plurality of second fasteners 61, and the electrostatic chuck 12 and the electrostatic chuck placement plate 13 are fastened by the plurality of first fasteners 60 radially inside the plurality of second fasteners 61. In this case, since it is possible to fasten the vicinity of the center of the stage 11 using the first fasteners 60, it is possible to further improve the bending rigidity of the stage 11 and to suppress the warpage of the substrate W placed on the stage 11 more appropriately.

In addition, according to the present embodiment, the first fasteners 60 are arranged along a plurality of concentric circles having different diameters. With this configuration, it is possible to further improve the bending rigidity of the stage 11, and to suppress the warpage of the substrate W placed on the stage 11 more appropriately.

In addition, according to the present embodiment, each of the electrostatic chuck 12 and the electrostatic chuck placement plate 13 is fastened to the support 15 by inserting the plurality of second fasteners 61. With this configuration, the stage 11 is fastened to the support 15, whereby the stage 11 can be more easily attached to and detached from the support 15.

In addition, according to the present embodiment, the electrostatic chuck placement plate 13 is formed with the through holes 13b into which the second fasteners 61 are inserted, and the through holes 13b have a diameter larger than that of the second fasteners 61. Thus, even if warpage occurs in a second fasteners 61, the warpage can be absorbed by the gap formed between the inner wall of the through hole 13b and the second fastener 61.

In addition, according to the present embodiment, the electrostatic chuck 12, the electrostatic chuck placement plate 13, and the support 15 are configured to have substantially the same outer diameter, and the outer diameter is configured to be, for example, 340 mm to 360 mm. In such a case, the present embodiment is also applicable to an existing plasma processing apparatus. For example, even if the support 15 is used as in the existing plasma processing apparatus and the stage is replaced, when the stage 11 of the present embodiment is used, the other members may be used as they are without changing the design thereof. Moreover, since the bending rigidity of the stage 11 after replacement is improved as described above, it is possible to suppress the distortion of the stage of the related art.

In addition, when using the existing plasma processing apparatus as described above, the fastening holes 15a formed in the support 15 may also be used. In such a case, in the stage 11, the through holes 12e in the base portion 12b and the through holes 13b in the electrostatic chuck placement plate 13 may be formed at positions corresponding to the fastening holes 15a. In other words, when replacing the stage 11 using the existing plasma processing apparatus, no special fastener for fixing the electrostatic chuck placement plate 13 and the support 15 is required.

Further, according to the present embodiment, each of the electrostatic chuck 12, the electrostatic chuck placement plate 13, and the support 15 is formed in a substantially cylindrical shape having substantially the same outer diameter. As described above, since the stage has a cylindrical shape, electromagnetic design may be easily performed. In addition, it is possible to simplify the shapes of the electrostatic chuck 12, the electrostatic chuck placement plate 13, and the components provided around the support 15 such as, for example, the focus ring 16, the spacer 17, and an insulator ring (not illustrated). Furthermore, the number of components does not increase.

In addition, according to the present embodiment according to another point of view, the plasma processing apparatus 1 that performs a plasma processing on a substrate W includes a processing container 10 that defines a processing space S in which plasma is generated, a stage 11 configured to place the substrate W thereon inside the processing container 10, and the support 15 provided inside the processing container 10 to support the stage 11. The stage 11 includes an electrostatic chuck 12 having a placement portion 12a, an electrostatic chuck placement plate 13 provided on the support 15 side of the electrostatic chuck 12 and configured to place the electrostatic chuck thereon. The electrostatic chuck 12 and the electrostatic chuck placement plate 13 are fastened by a plurality of first fasteners 60 from the electrostatic chuck placement plate 13 side, and the stage 11 is fastened to the support 15 by a plurality of second fasteners 61 from the electrostatic chuck 12 in an outer peripheral region 12c which is located on the radially outer side of the placement portion 12a.

In addition, each of the electrostatic chuck 12 and the electrostatic chuck placement plate 13 is fastened to the support 15 by inserting the second fasteners 61 therethrough, and the plasma processing apparatus 1 has a focus ring 16 disposed to surround the placement surface of the stage 11 in a plan view. In addition, in the present embodiment, each of the electrostatic chuck 12, the electrostatic chuck placement plate 13, and the support 15 have substantially the same outer diameter, and the temperature control mechanism of the focus ring 16 is not provided.

Figure 7:
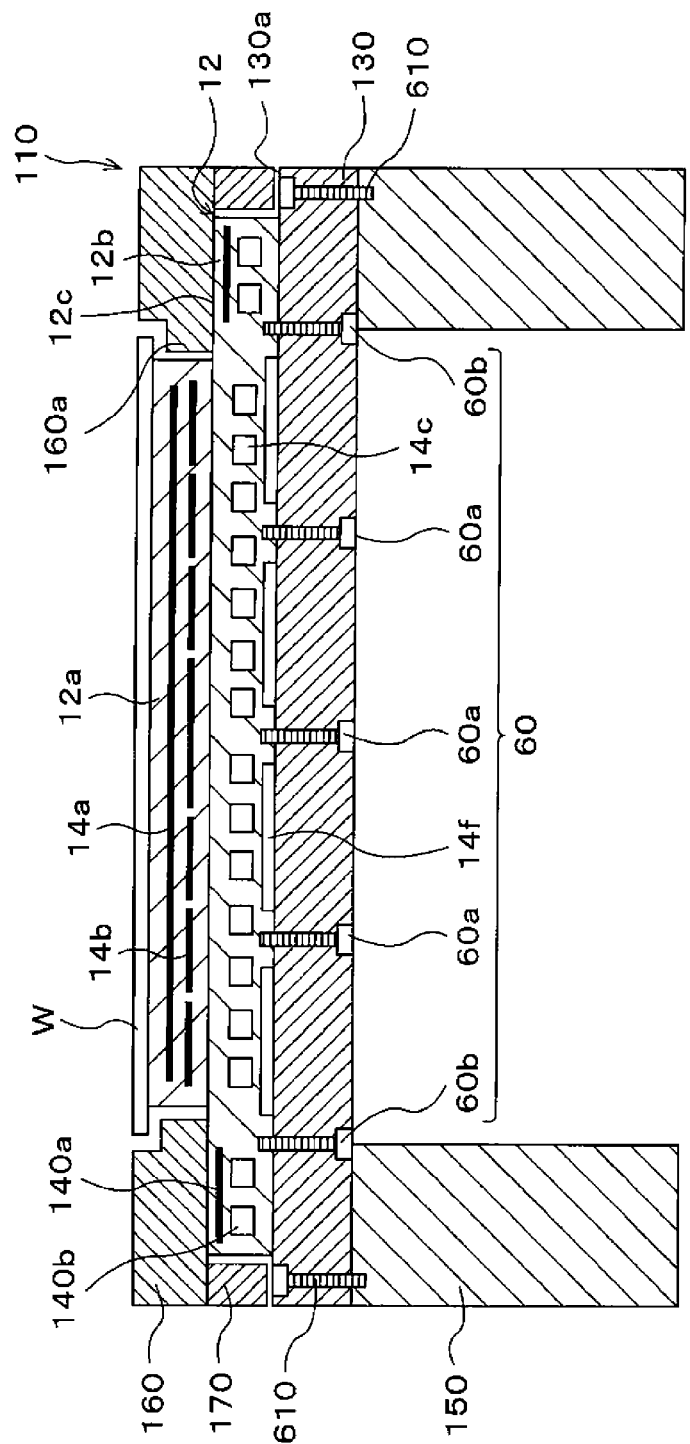
FIG. 7 is a vertical cross-sectional view schematically illustrating the outline of a configuration of a stage according to a second embodiment.

Next, the configuration of the stage 110 according to the second embodiment will be described with reference to FIG. 7. FIG. 7 is a vertical cross-sectional view schematically illustrating the outline of a configuration of a plasma processing apparatus according to an embodiment. In addition, the components which are substantially the same as those of the stage 11 according to the first embodiment described above will be denoted by the same reference numerals and the descriptions thereof will be omitted.

As illustrated in FIG. 7, a stage 110 according to the second embodiment includes an electrostatic chuck placement plate 130 in addition to the electrostatic chuck 12 of the first embodiment. The electrostatic chuck placement plate 130 has an outer diameter larger than that of the base portion 12b of the electrostatic chuck 12, for example, an outer diameter of about 420 mm, and is fixed to a support 150 having an outer diameter which is substantially the same as that of the electrostatic chuck placement plate 130. An outer peripheral region 130a formed by a difference between the outer diameters of the electrostatic chuck placement plate 130 and the base portion 12b is formed in a substantially annular shape on the upper surface of the electrostatic chuck placement plate 130 and outside the outer periphery of the base portion 12b.

Figure 8:
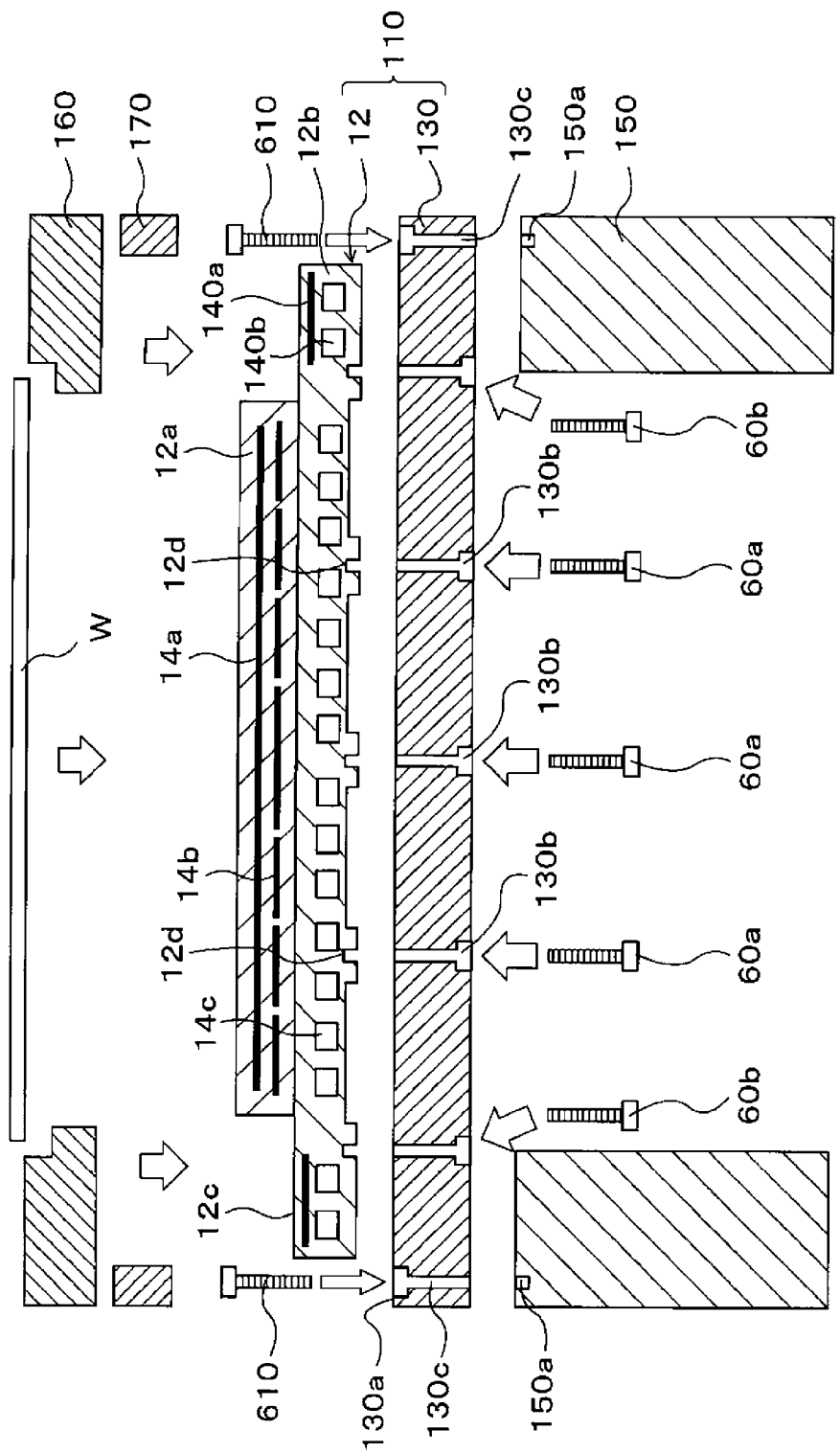
FIG. 8 is an explanatory view schematically illustrating a method of assembling the stage according to the second embodiment.

The electrostatic chuck 12 and the electrostatic chuck placement plate 130 form a stage 110 by being fastened by the first fasteners 60. As illustrated in FIG. 8, the first fasteners 60 are fastened to the fastening holes 12d formed in the central region of the base portion 12b through the through holes 130b formed in the electrostatic chuck placement plate 130 from the electrostatic chuck placement plate 130 side toward the electrostatic chuck 12 side.

In addition, as illustrated in FIGS. 7 and 8, the first fasteners 60 are disposed so as to doubly overlap each other in the radial direction along concentric circles which are concentric with the stage 110. That is, the inner first fasteners 60a and the outer first fasteners 60b are provided along concentric circles having different diameters.

The stage 110 configured in this way is fastened on the support 150 provided therebelow by the second fasteners 610. As illustrated in FIG. 8, through holes 130c are formed in the outer peripheral portion of the electrostatic chuck placement plate 130 outside the heater 14b of the electrostatic chuck 12 and the coolant flow path 14c. The second fasteners 610 does are inserted through the through holes 130c without penetrating the outer peripheral region 12c of the electrostatic chuck 12, and are fastened to the fastening holes 150a formed in the support 150. For example, screws are used as the second fasteners 610, and are screwed into the fastening holes 150a in which screw grooves are formed.

In the present embodiment, twelve second fasteners 610 are provided along the outer peripheral portions of the electrostatic chuck placement plate 130 and the support 150 at regular intervals.

In addition, above the outer peripheral region 130a of the electrostatic chuck 130 and on the radially outer side of the electrostatic chuck 12 in a plan view, a focus ring 160 formed in an annular shape is provided to surround the placement portion 12a. The focus ring 160 is provided through a spacer 170 to be coaxial with the electrostatic chuck 12. The focus ring 160 and the spacer 170 have, for example, an outer diameter substantially the same as the outer diameter of the electrostatic chuck placement plate 130 and larger than that of the electrostatic chuck 12. In addition, on the inner peripheral surface of the focus ring 160, a protrusion 160a that protrudes radially inward is formed.

In addition, according to the second embodiment, temperature control mechanisms 140a and 140b configured to control the temperature of the focus ring 160 may be further provided. For example, a heater is used for the temperature control mechanism 140a. The temperature control mechanism 140b is, for example, a coolant flow path, and a coolant circulates therein. This makes it possible to perform the temperature control of the focus ring 160 so as to appropriately perform a plasma processing. In addition, the installation positions of temperature control mechanisms 140a and 140b can be selected arbitrarily.

As described above, according to the present embodiment, the electrostatic chuck placement plate 130 to which the electrostatic chuck 12 is fastened on the upper side by the first fasteners 60 is fastened to the support 150 by inserting the plurality of second fasteners 610 on the radially outer side of the electrostatic chuck 12. Therefore, it is possible to shorten the second fasteners 610 and thus it is possible to suppress the bending stress which is generated when the second fasteners 610 are bent inside the stage 110. As a result, it is possible to improve the bending rigidity of the stage 110.

In addition, according to the present embodiment, even though the stage 110 is enlarged in the radial direction, for example, compared to the stage of the existing plasma processing apparatus, the dimensions of the electrostatic chuck 12 do not change. For this reason, as for a member provided on the radially outer side of the electrostatic chuck 12, for example, an insulation part (not illustrated), it is possible to use a member which is the same thing as the one in the related art.

Further, according to the present embodiment according to another point of view, in the plasma processing apparatus 1 for performing a plasma processing on a substrate W, the electrostatic chuck placement plate 130 fastened to the support 150 by inserting the second fasteners 610 on the radially outer side of the electrostatic chuck 12, and the plasma processing apparatus 1 includes the focus ring 160 disposed to surround the placement surface of the stage 110 in a plan view.

In addition, the plasma processing apparatus 1 includes temperature control mechanisms 140a and 140b for controlling the temperature of the focus ring 160. In such a case, it is possible to appropriately perform the plasma processing by performing the temperature control of the focus ring 160.

For example, although the above-described plasma processing apparatus 1 has been described as an example of a capacitively coupled plasma processing apparatus, the stage 11 and the stage 110 may be employed in any plasma processing apparatus. For example, the plasma processing apparatus may be any type of plasma processing apparatus, such as, for example, an inductively coupled plasma processing apparatus or a plasma processing apparatus that excites a gas by surface waves such as microwaves.

Although the electrostatic chuck placement plates 13 and 130 of the plasma processing apparatus 1 described above are made of a conductive metal, the electrostatic chuck placement plates may be made of, for example, a material having an insulating property or a high resistance. In such a case, a power supply rod (not illustrated) for energizing, for example, the electrode 14a provided in the electrostatic chuck 12 is provided through the electrostatic chuck placement plate 13 or 130. The electric supply rod is connected to a radio-frequency power supply through, for example, a matcher.

According to the present disclosure, it is possible to improve the bending rigidity of the stage and to improve the ease of attachment and detachment of the stage with respect to the support.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A stage comprising:
an electrostatic chuck; and
an electrostatic chuck placement plate on which the electrostatic chuck is placed,
wherein the electrostatic chuck includes a first plate having a substrate placement surface on which a substrate is placed, and a second plate supporting the first plate, wherein the second plate and the electrostatic chuck placement plate are fastened by a plurality of first fasteners from a side of the electrostatic chuck placement plate, wherein the stage is fastened to a support provided on an opposite side of the electrostatic chuck placement plate by a plurality of second fasteners on a radially outer side of the substrate placement surface, and wherein the plurality of second fasteners penetrate both the second plate and the electrostatic chuck placement plate fastened by the plurality of first fasteners.

2. The stage according to claim 1, wherein the plurality of first fasteners and the plurality of second fasteners are arranged along concentric circles of the electrostatic chuck placement plate, an outer peripheral portion of the stage is fastened to the support by the plurality of second fasteners, and the second plate and the electrostatic chuck placement plate are fastened by the plurality of first fasteners on a radially inner side of the plurality of second fasteners.

3. The stage according to claim 2, wherein the plurality of first fasteners are arranged along a plurality of concentric circles having different diameters.

4. The stage according to claim 3, wherein the electrostatic chuck placement plate has a through hole to insert and pass a second fastener of the plurality of second fasteners, and a gap is formed between the second fastener and an inner wall surface of the through hole.

5. The stage according to claim 4, wherein the outer diameter of the second plate ranges from 340 mm to 360 mm.

6. The stage according to claim 1, wherein the electrostatic chuck placement plate has a through hole to insert and pass a second fastener of the plurality of second fasteners, and a gap is formed between the second fastener and an inner wall surface of the through hole.

7. The stage according to claim 6, wherein the second fastener is a screw, the support has a fastening hole in which screw grooves are formed, and the electrostatic chuck placement plate and the second plate are fastened to the support when the second fastener and the fastening hole are screwed together.

8. The stage according to claim 1, wherein the outer diameter of the second plate ranges from 340 mm to 360 mm.

9. The state according to claim 1, wherein the first plate is made of an insulator and an electrode is placed within the insulator.

10. The stage according to claim 1, wherein a flow path is formed inside the second plate.

11. The stage according to claim 1, wherein at least one of the plurality of first fasteners is disposed closer to a center of the second plate than an edge of the second plate.

12. The stage according to claim 1, wherein the support is a cylindrical insulator, and the electrostatic chuck placement plate is made of a metal.

13. A plasma processing apparatus comprising:

a processing container that defines a processing space in which plasma is generated to perform a plasma processing on a substrate;

a stage configured to place the substrate thereon inside the processing container; and a support provided inside the processing container to support the stage, wherein the stage includes:

an electrostatic chuck, and an electrostatic chuck placement plate provided on a side of the support of the electrostatic chuck, the electrostatic chuck being placed on the electrostatic chuck placement plate, and wherein the electrostatic chuck includes a first plate having a substrate placement surface on which the substrate is placed, and a second plate supporting the first plate, wherein the second plate and the electrostatic chuck placement plate are fastened by a plurality of first fasteners from a side of the electrostatic chuck placement plate, wherein the stage is fastened to the support by a plurality of second fasteners on a radially outer side of the substrate placement surface, and wherein the plurality of second fasteners penetrate both the second plate and the electrostatic chuck placement plate fastened by the plurality of first fasteners.

14. The plasma processing apparatus according to claim 13, wherein the second plate and the electrostatic chuck placement plate are each fastened to the support by inserting the plurality of second fasteners, and the plasma processing apparatus further comprises a focus ring disposed to surround the substrate placement surface in a plan view.

15. The plasma processing apparatus according to claim 13, wherein the first plate is made of an insulator and an electrode is placed within the insulator.

16. The plasma processing apparatus according to claim 13, wherein a flow path is formed inside the second plate.

17. The plasma processing apparatus according to claim 13, wherein the electrostatic chuck placement plate has a through hole to insert and pass a second fastener of the plurality of second fasteners, and a gap is formed between the second fastener and an inner wall surface of the through hole.

18. The plasma processing apparatus according to claim 17, wherein the second fastener is a screw, the support has a fastening hole in which screw grooves are formed, and the electrostatic chuck placement plate and the second plate are fastened to the support when the second fastener and the fastening hole are screwed together.

19. The plasma processing apparatus according to claim 13, wherein the support is a cylindrical insulator, and the electrostatic chuck placement plate is made of a metal.

* * * * *